United States Patent [19]
Hashimoto

[11] Patent Number: 6,130,110
[45] Date of Patent: Oct. 10, 2000

[54] FILM CARRIER TAPE, TAPE CARRIER SEMICONDUCTOR DEVICE ASSEMBLY, SEMICONDUCTOR DEVICE, AND METHOD OF MAKING THE SAME, MOUNTED BOARD, AND ELECTRONIC DEVICE

[75] Inventor: Nobuaki Hashimoto, Suwa, Japan

[73] Assignee: Seiko Epson Corporation, Tokyo, Japan

[21] Appl. No.: 09/091,126

[22] PCT Filed: Oct. 15, 1997

[86] PCT No.: PCT/JP97/03707

§ 371 Date: Jun. 16, 1998

§ 102(e) Date: Jun. 16, 1998

[87] PCT Pub. No.: WO98/18163

PCT Pub. Date: Apr. 30, 1998

[30] Foreign Application Priority Data

Oct. 22, 1996 [JP] Japan .................................. 8-298067

[51] Int. Cl.[7] .............................. H01L 21/48; H01L 21/50
[52] U.S. Cl. .............................. 438/106; 438/25; 438/26; 438/51; 438/64
[58] Field of Search ..................................... 438/106, 126, 438/25, 26, 51, 55, 64–67

[56] References Cited

U.S. PATENT DOCUMENTS

| | | | |
|---|---|---|---|
| 4,792,532 | 12/1988 | Ohtani et al. | 437/206 |
| 4,917,286 | 4/1990 | Pollacek | 228/110 |
| 4,982,265 | 1/1991 | Wantanabe et al. | 357/75 |
| 5,075,252 | 12/1991 | Schendelman | 437/207 |
| 5,107,325 | 4/1992 | Nakayoshi | 357/69 |
| 5,231,303 | 7/1993 | Kasahara . | |

FOREIGN PATENT DOCUMENTS

| | | |
|---|---|---|
| 0 684 644 A1 | 11/1995 | European Pat. Off. . |
| 52-37770 | 3/1977 | Japan . |
| 63-141331 | 6/1988 | Japan . |
| 63-97235 | 6/1988 | Japan . |
| 64-81330 | 3/1989 | Japan . |
| 2-210845 | 8/1990 | Japan . |
| 6-69276 | 3/1994 | Japan . |
| 7-321157 | 12/1995 | Japan . |
| WO 95/08856 | 3/1995 | WIPO . |

OTHER PUBLICATIONS

Michael Pecht, ed. Handbook of Electronic Package Design, Marcel Dekker: New York, pp. 187–192 and 256–257, 1991.

*Primary Examiner*—Charles Bowers
*Assistant Examiner*—Eric J Kielin
*Attorney, Agent, or Firm*—Oliff & Berridge, PLC

[57] ABSTRACT

A film carrier tape provides reduced occurrence of lead bending during the making process, and allows a chip-size package to be made with high reliability, while increasing the yield. The extremities of TAB leads (54a, 54b) are not connected to a frame (59), but are formed as free ends from the time of formation of the pattern, and are not subject to any process at all until the final bonding process. On the other hand, a plurality of link portions (57a to 57j) are provided within the mounting area of a semiconductor chip, linking many of leads within the mounting area of an IC chip, and through these link portions connecting them to a frame.

26 Claims, 15 Drawing Sheets

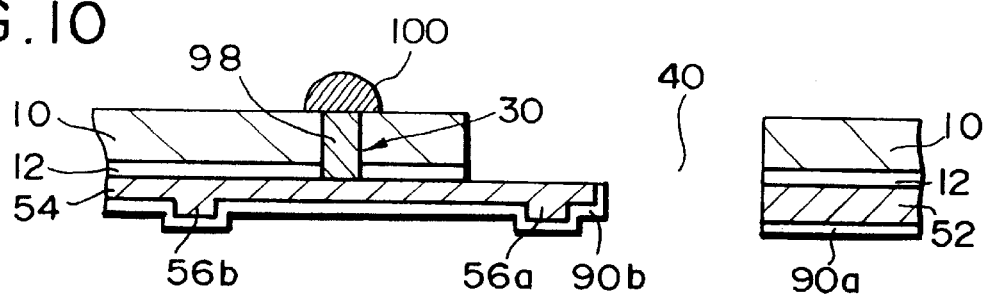
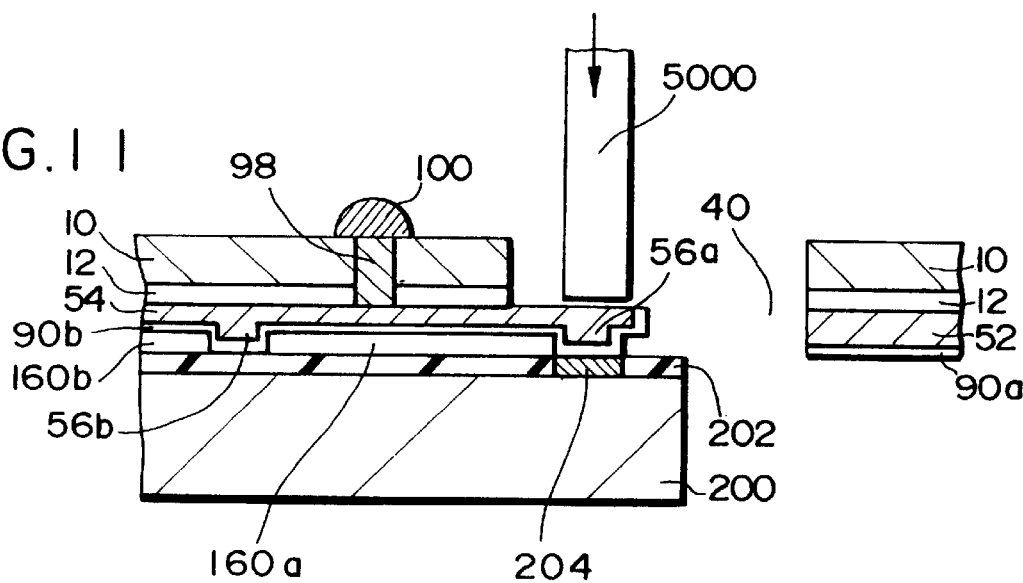
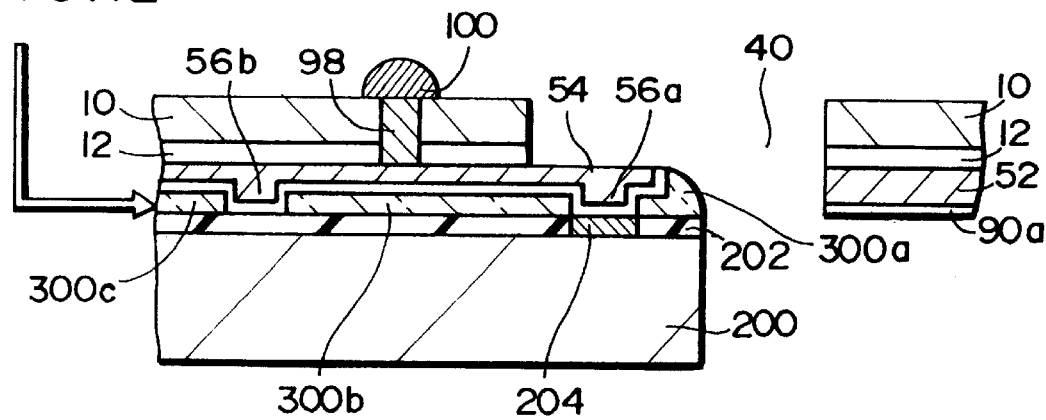

6,130,110

FILM CARRIER TAPE, TAPE CARRIER SEMICONDUCTOR DEVICE ASSEMBLY, SEMICONDUCTOR DEVICE, AND METHOD OF MAKING THE SAME, MOUNTED BOARD, AND ELECTRONIC DEVICE

TECHNICAL FIELD

The invention relates to a method of making a film carrier tape, a method of making a tape carrier semiconductor device assembly, a method of making a semiconductor device, a film carrier tape, a semiconductor device, a mounted board, and an electronic device, and particularly to Chip Size/Scale Package (CSP) fabrication technology and mounting technology for CSP.

BACKGROUND ART

There is no formal definition of Chip Size/Scale Package (hereinafter called CSP), but generally this refers to a semiconductor package (IC package) in which the package size is the same as or only very slightly larger than the chip size. The development of CSP technology is very important for promoting high-density mounting.

One prior art publication relating to CSP is International Publication WO95/08856. In this publication, the method is adopted in which a lead frame is mounted on a lead frame support (special-purpose jig), and the leads are cut respectively (one by one) by a special tool, while at the same time the severed leads are bent downward, and are connected to bonding pads of the IC chip.

With this method, a special jig or equipment is required, and additionally leads may easily be made bent during the bonding to the IC chip by the cutting of the leads.

SUMMARY OF THE INVENTION

The methods and systems of this invention includes steps for making a film carrier tape. The steps include forming a conducting foil on an insulating film and forming from the conducting foil a conductor pattern having a plurality of leads, each leads with one end formed as a free end and with an electrical connection portion on the free end for connection to at least one semiconductor chip. There are also link portions for linking together the plurality of leads and the link portions are provided within a mounting area of the semiconductor chip. A frame is electrically connected to all of the leads through the link portions. The steps also include plating the conductor pattern and stamping out the link portions, thereby electrically isolating each of the plurality of leads.

According to the invention, prior TAB (Tape Automated Bonding) production line and existing technology can be used, reducing the burden for new equipment and the development of special technology.

The most important extremities of the leads (the portions for connection to a semiconductor chip; the so-called fingers) are not connected to a frame, but are free, (that is to say, are terminated), and are not subject to any process at all until the bonding process. In the bonding process, since the fingers are already terminated, cutting is not required, and there is no risk of shear stress. That is to say, from the time the pattern is formed, no external load is applied to the leads, therefore, bending of the leads is prevented. As a result, the positioning of the leads and the bonding pads of the semiconductor chip can be carried out accurately.

However, in order to carry out, for example, electroplating in a single operation on the plurality of leads formed on the insulating film of polyimide or the like, all of the leads must inevitably be electrically connected to the frame.

For this reason, the invention has a plurality of link portions disposed within the mounting area of the semiconductor chip. The link portions link a plurality of leads within the mounting area of a semiconductor chip, and thus electrical connection of the leads to the frame is achieved through these link portions. By means of this, a voltage is applied to the frame. For example, one electrode (generally the anode) is connected to the frame to allow electroplating to be applied to the entire conductor pattern together, including the leads.

Next, the link portions, which are no longer needed, are die-stamped out and removed together with the insulating film, thereby electrically isolating the leads from each other. This die-stamping-out can be carried out in single operation, and does not complicate the process. Besides, the link portions are disposed within the mounting area of a semiconductor chip, separated from the extremities (fingers) of the leads positioned on the periphery of the chip mounting area. As a result, the cutting of the link portions has no effect on the extremities (fingers) of the leads. In this way, without complicating the process, the bending of leads is prevented, and reliable bonding is possible.

In the step of forming the conductor pattern, pad portions for forming external connection terminals may be further formed between the leads and the link portions. However, before the step of forming the conducting pattern, a stamping-out step of forming a hole at a predetermined position in the insulating film may be done so as to allow gas to escape.

The semiconductor chip may have electrodes positioned away from an electrical connection portion. Under these circumstances, the invention further comprises a step of forming an electrically conducting projection on each of the leads at a position differing from the one end where one of the electrodes is to be positioned. The electrically conducting projection is formed for the purpose of connecting to a mounting substrate, i.e., a printed wiring board or the like.

The invention may be further comprised of a step for forming a projection in an area excluding the electrical connection portion of the conductor pattern where the semiconductor chip is mounted. For example, it should be noted that when the projection is formed on the film carrier tape side, the projection may be formed not during the fabrication of the film carrier tape, but during the fabrication of the CSP package.

Before the step of forming the conductor pattern, an opening may be formed in the insulating film, and an edge of the free end may be positioned within an area of the opening. When the opening is formed,the extremities of the leads are left as free ends in order to carry out reliable bonding.

At a position adjacent to the opening in the insulating film and on an extended line from the free end of each of the leads, a marking for bending detection of each of the leads may be formed. In the event that a lead (finger) is bent, the bend must be detected, and the faulty product must be identified. The lead bending detection marking is formed as a reference datum for distinguishing any lead bend. The marking for the bending detection may be formed in the same step for forming the conductor pattern.

For example, by means of selective etching of the conducting pattern, the marking for the bending detection (dummy leads) is formed together with the desired conductor pattern. According to this method, no separate step is required for forming the marking for the bending detection, and therefore the fabrication process is not made more complicated.

The invention may further comprise a step of detecting a bend of each of the leads by doing a comparison between a position of the marking for the bending detection and a positionrelating to the one end terminating each of the leads. By this means, faulty products can be identified.

In the step of forming the conductor pattern, a part of the plurality of leads may be formed to have a pair of projections projecting from the insulating film over the opening and the leads can include a connection portion connecting the pair of projections.

In principle, in the invention the extremities of the leads (fingers) are terminated and formed as free ends. However, in order to accommodate the bonding pad positions of the semiconductor chip, for example, it may be necessary to position the extremities of a plurality of leads (fingers) on a line, and in such a case, a lead extremity (finger) may have to be formed in a bent shape. If, however, the end of a lead is bent, due to gravity, the lead tends to twist. In such a case, a "U-shaped" lead may be used, and the point of connection with the semiconductor chip may be supported by two lead portions. By this means the twisting position does not work. In particular, in order to achieve good lateral balance, a shape which is bilaterally symmetrical is preferable. For example, the projections and the connection portion may preferable form a right angle.

By making the lead configuration a pattern appropriate to a systemcomprising orthogonal coordinates adopted in a TAB production line (specifically, for example, a pattern including no radiating lines or curved arcs, but only orthogonal straight lines), discrimination of lead bending and so forth is easy, and can be carried out automatically by means of a sensor. One of the projections and another of the Projections may be separated and leads may be provided there-in-between.

In the step of forming the conductor Pattern, a process may be carried out in a thickness direction of each of the leads so that the electrical connection portion to the semiconductor chip on each of the leads is to have a projecting shape.

In a normal TAB process, for the purpose of connecting the TAB leads and the semiconductor chip, metal bumps (projections) are formed on the semiconductor chip, but the formation of these bumps is considerably troublesome. Here, in place of forming the bumps on the semiconductor chip, bumps (projections) are formed on the TAB leads. For example, by carrying out half-etching, reducing the thickness, in positions other than the extremities of the leads, the extremities (fingers) of the leads are caused to project by a corresponding amount. The technology for forming these lead extremities is an established technology already developed by the present applicant, and can be realized by utilizing an existing TAB production line. Besides, in this case, the aluminum pads on the semiconductor chip may simply be exposed, and the process can be simplified since the metallic bumps are not required.

The film carrier tape of the invention is made by the method described above. Thus, a film carrier tape appropriate to CSP fabrication is obtained.

The film carrier tape of the invention comprises an insulating film having a lead hole formed therein. There is a lead on the insulating film, the lead having one end which extends into an area of the lead hole and this end is associated with a free end. There is also provided a marking for the bending detection of the lead formed on the insulating film and which is positioned on an extended line from the free end of the lead. A pad portion for forming an external connection terminal may be formed at the non-free end of the lead.

The film carrier tape of the invention is obtained by making an insulating film having a lead hole formed therein. A conductor pattern can be formed on the insulating film having a plurality of leads for connection to a semiconductor chip. A link portion linking together the plurality of leads can be provided within a mounting area of the semiconductor chip. A frame is electrically connected to all of the leads through the link portion and thereafter a hole is formed in the link portion of the conductor pattern.

The film carrier tape of the invention comprises an insulating film and a plurality of leads formed in parallel on the insulating film. A pair of leads positioned adjacent to the plurality of leads are separated by a predetermined distance and are mutually connected together. Another lead can be formed between the pair of leads.

The method of making a tape carrier semiconductor device assembly of the invention includes mounting a plurality of semiconductor chips on an insulating film of a film carrier. The electrodes of each of the semiconductor chips are connected to the free end of each of the plurality of leads which is terminated.

By exploiting the characteristics of the TAB method and taking a film carrier tape as a unit, a single continuous operation is carried out to fabricate a plurality of semiconductor device assemblies. These assemblies, as a unit, may also be supplied to a customer.

The invention may further comprises a step of inserting a sealing material between the semiconductor chips and the insulating film. The sealing material serves to protect the semiconductor chip, and also to absorb the difference in thermal expansion coefficients of the chip and the insulating film. The sealing material may comprise epoxy resin, silicone resin, elastomer, and so forth. The method of making a semiconductor device of the invention is by die-stamping out the tape carrier semiconductor device assembly made by the method of making a tape carrier semiconductor device assembly. The semiconductor device (CSP packages), the final product, is obtained by final die-stamping-out into individuals. It should be noted that the electrically conducting projections may be also formed at this stage.

The semiconductor device of the invention is made by the above-mentioned method of making a semiconductor device. Thus, a semiconductor device of high reliability is obtained. Also because it takes the form of a package, burn-in and other treatment is possible.

The mounted board of the invention has a conductive layer formed thereon, wherein an external connection terminal of the above-mentioned semiconductor device is connected to the conductive layer. This is a high-density mounted board, with a semiconductor device mounted which is chip-size packages CSP).

For example, even if air bubbles are formed at the boundary surface of the sealing material and the semiconductor chip, the holes created in the insulating film by die-stamping out the link portions function as gas escape holes, and for example, steam and the like created when the package is heated is allowed to escape to the outside. The reliability of the package is not, therefore, impaired.

The electronic device of the invention incorporates the above-mentioned mounted board. In particular, the reliability of a portable electronic instrument and so on, which is destined to be made compact and light, is improved.

The method of making a semiconductor device of the invention comprises a step of forming a conducting foil on an insulating film and a step of forming from the conducting foil a conductor pattern having a plurality of leads each with one end formed as a free end for connection to a semiconductor chip. There is a link portion linking together the plurality of leads and provided within a mounting area of the semiconductor chip. A frame is electrically connected to all of the leads through the link portion. There is a step of plating the conductor pattern and a step of stamping out the link portion, electrically isolating each of the plurality of leads. A part of the leads can be connected to the electrodes of the semiconductor chip and the frame and the plurality of leads can be finally separated, forming the semiconductor device.

In the invention, the TAB leads are separated from the frame after the connection to the semiconductor chip is completed, so that there is no risk of making semiconductor chip bonding degraded due to the bending of leads. This is appropriate to cases where the package size requirements are relatively relaxed.

Also, there may be further comprised a step of filling a resin between the semiconductor chip and the insulating film, between the step of connecting to electrodes and the step of separation to form the semiconductor device.

The object of the invention is to use, as far as possible, prior production lines and existing technology, thereby reducing the burden of acquiring additional equipment and developing special technology. It is further the object of the invention to reduce the occurrence of bent leads during the making process, and thus making a chip-size package with high reliability, while increasing the yield.

BRIEF DESCRIPTION OF DRAWINGS

FIG. 10 is a cross-sectional view of a film carrier tape and semiconductor chip, showing the ninth step in the method of making a semiconductor device of the invention;

FIG. 11 is a cross-sectional view of a film carrier tape and semiconductor chip, showing the tenth step in the method of making a semiconductor device of the invention;

FIG. 12 is a cross-sectional view of a film carrier tape and semiconductor chip, showing the eleventh step in the method of making a semiconductor device of the invention;

DETAILED DESCRIPTION OF PREFERRED EMBODIMENTS

The embodiments pertaining to the invention are now described with reference to the drawings. In a first exemplary embodiment, TAB (Tape Automated Bonding) technology is used in implementing the fabrication of a chip-sized semiconductor device. In the process of this embodiment,existing TAB production line techniques and existing technology are used, thereby reducing the need for additional equipment and the development of special technology. Thus fabricating a chip-size package with high reliability, while increasing the yield, is possible.

Before discussing the first exemplary embodiment, principal characteristics thereof are described with reference to FIGS. 19 to 21D.

Figure 19:
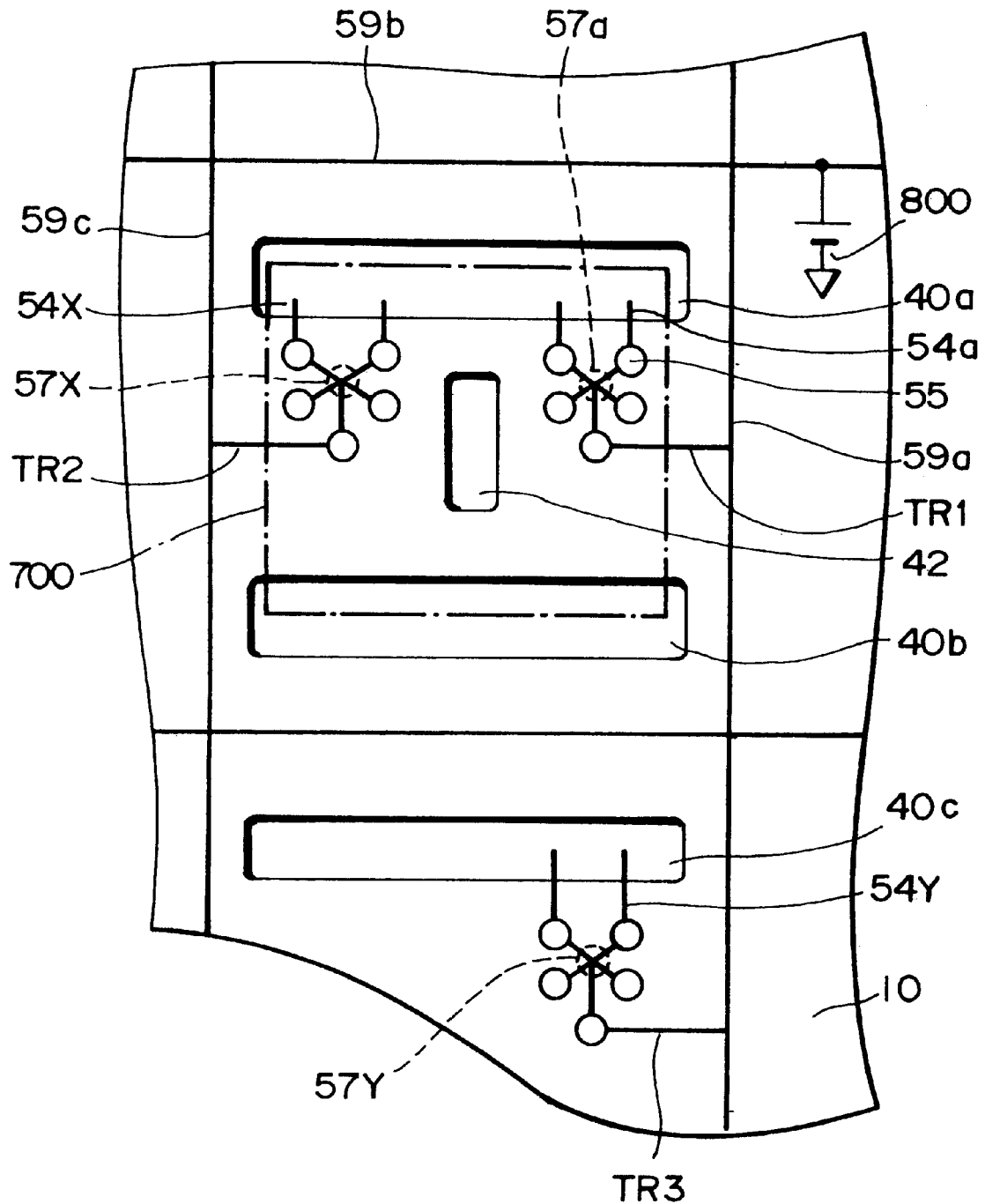
FIG. 19 is an explanatory diagram showing characteristics of the method of making a film carrier tape (method of making a semiconductor device) of the invention.

As shown in FIG. 19, on a polyimide film 10 in which are provided certain openings (lead holes 40a to 40c, a resin injection hole 42, and so forth), a conducting materialmade of copper or the like, is provided in the form of foil, and a conductor pattern is formed therein by for example etching. This conductor pattern may be formed on the front or reverse side of the polyimide film. It is also possible for the conductor pattern to be formed on both sides. In this case, although not shown in the drawings, through holes may be formed in the polyimide film and may be used to provide conduction between both sides.

This conductor pattern comprises frames 59a, 59b and 59c, leads (54a to 54x, 54y, and so forth), pads 55 having unitary or integral electrically conducting projections, a plurality of link portions (57*a* to 57*x*, 57*y*, and so forth) linking each lead (and each pad) mutually, and suspension leads (TR1 to TR3, and so forth) electrically connecting the frame and a group of leads.

It should be noted that it is not essential that the pads are formed with electrically conducting projections, and projections may equally be formed on the mounting side, that is, on a motherboard, for example. Even in the case that the pads are formed with electrically conducting projections, they may, without restriction, be formed in advance when the tape is formed, or at a later stage, for example during the formation of the package or after that.

The extremities of the leads (54*a* to 54*x*, 54*y*, and so forth) which connect to the semiconductor chip are termed "fingers". Each finger is a free end, terminating over a lead hole (40*a* to 40*c*) (that is within the lead hole). In other words, a finger positioned within the lead hole is already terminated when the pattern is formed, and undergoes no further process until the final connection (bonding) to the bonding pads of the semiconductor chip. Even during the bonding to the bonding pads of the semiconductor chip, since the finger is a free end, there is no need to cut the leads, and as a result, finger bending due to the stress of cutting does not occur. For this reason, the accurate positioning and bonding of the leads to the semiconductor chip is possible.

However, in order to carry out electroplating in a single operation on all of the plurality of leads (54*a* and so forth) which are formed on the insulating film of polyimide or the like, it is necessary for all of the leads to be electrically connected to the frame (59*a*, 59*b*, and 59*c*). Here, in this exemplary embodiment, a plurality of link portions (57*a* to 57*x*, 57*y*, and so forth) are disposed within the area of mounting the semiconductor chip, and the link portions (57*a* to 57*x*, 57*y*, and so forth) link a number of leads within the area of mounting the semiconductor chip. Through the link portions (57*a* to 57*x*, 57*y*, and so forth) electrical connections to the frame 59*a*, 59*b* and 59*c* are made. By this means, by connecting the frame 59*a*, 59*b* and 59*c* to one pole of a battery 800, electroplating of the conductor pattern including the leads (54*a* and so forth) can be carried out in a single operation. It should be noted that the "area of mounting the semiconductor chip" and the "mounting area of a single IC chip" are applicable and both correspond substantially to the CSP end 700 outlined by a dot-dash line in FIG. 19.

Some of t he link portions (57*a* to 57*x*, 57*y*, and so forth) which are no longer needed are cut away by die-stamping-out, together with the insulating film, so that the leads (54*a* to 10 54*x*, 54*y*, and so forth) are electrically isolated. This die-stamping can be carried out in a single operation, and does not complicate the fabrication process. Although involving a complication of the process, the insulating film portion does not necessarily have to be cut out, and it is sufficient at least to cut out the lead portions to provide electrical isolation of each lead. The link portions (57*a* to 57*x*, 57*y*, and so forth) are disposed within the mounting area of a single semiconductor or IC chip, and are therefore away from the extremities (fingers) of the leads positioned at the boundary of the chip mounting area. As a result, the cutting of the link portions (57*a* to 57*x*, 57*y*, and so forth) has no effect on the lead extremities (fingers).

In this exemplary embodiment, a plurality of the link portions 57*a* and so forth are provided, but by making this number as small as possible, the die-stamping operation can be made simpler.

It should be noted that the holes formed by die-stamping out the link portions 57*a* and so forth can be used as injection holes for epoxy resin or the like (see FIG. 12), and in particular, if a hole is positioned in the center, the epoxy resin can be injected efficiently.

Furthermore, when the strength of the polyimide film 10 is considered, it is preferable for the positions of the plurality of link portions 57*a* to be dispersed. In this case, the holes formed by die-stamping out the link portion 57*a* can be used as an air escape hole when the epoxy resin is injected, or as a steam escape hole in the completed semiconductor device.

In this way, without making the fabrication process complicated, lead bending is prevented, and reliable bonding is made possible. Electroplating can be carried out in a single operations. Although in FIG. 19 only a part of the circuit pattern is shown, in practice the circuit pattern is formed continuously over the film.

Figure 20:
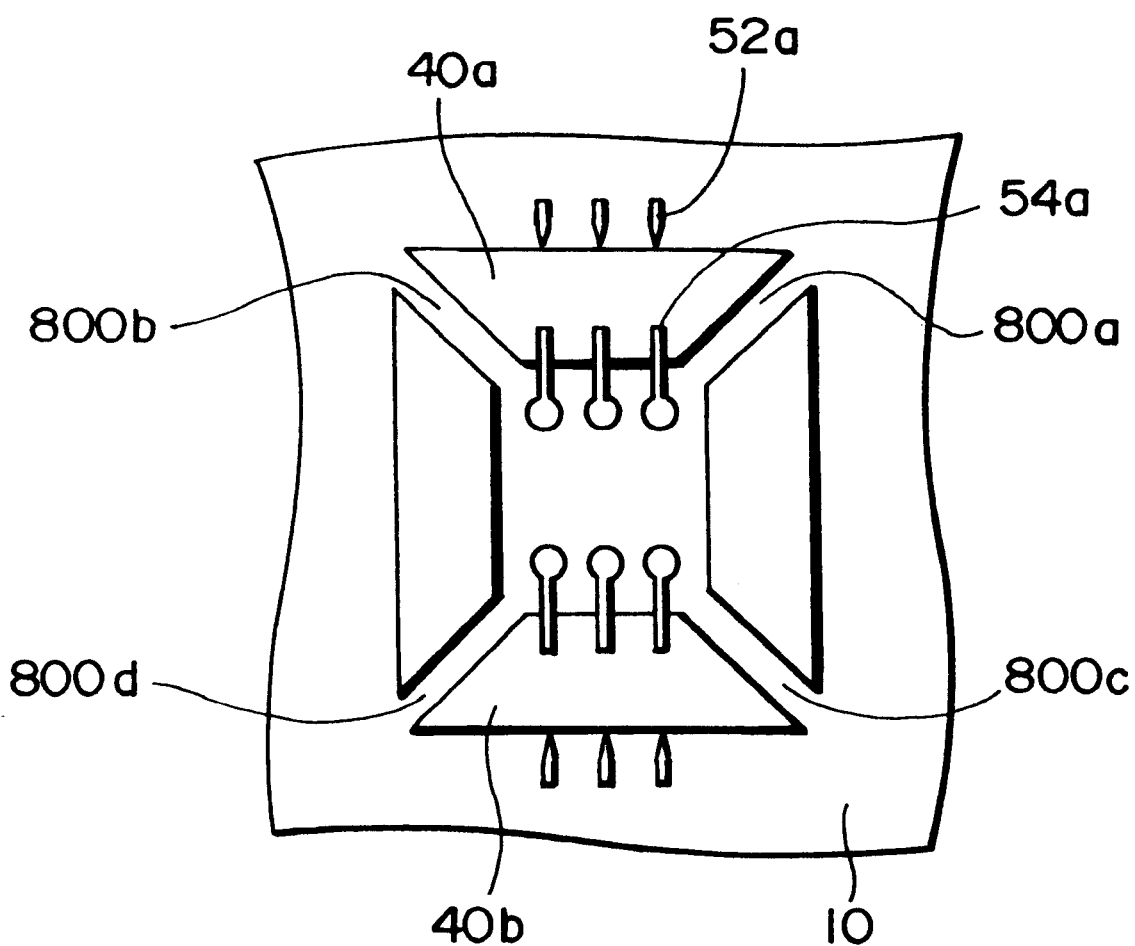
FIG. 20 is an explanatory diagram showing other characteristics of the method of making a film carrier tape (method of making a semiconductor device) of the invention.

Another exemplary embodiment aims to use conventional TAB technology, and to exploit existing production line and existing technology. Specifically, as shown in FIG. 20, the insulating film 10 in the mounting area of a single IC chip is supported by support bars 800*a*, 800*b*, 800*c*, and 800*d*, and unites with other parts of the insulating film. Therefore, continuous process in a single operation is possible for each insulating film as a processing unit. It should be noted that in FIG. 20 four support bars 800*a* to 800*d* are provided, but it is sufficient for at least two support bars to be provided. It is preferable for the two support bars to be disposed in opposing positions, for example from two parallel sides.

However, in the case of a conventional film carrier tape, there is no marking with respect to the bending of the extremities (fingers) of the lead 54*a*, and for this reason in this exemplary embodiment markings for the bending detection of leads (as a concrete example, dummy leads) are additionally provided. That is to say, dummy leads (52*a* and so forth) are provided, serving as a standard for determining finger bending.

The dummy leads (52*a* and so forth) are provided on the extended lines of the fingers. In this way, finger bending can be detected, and thus it is possible to separate out faulty products. In particular, the dummy lead 52*a* in FIG. 20 has a fine point end, making detection of the bending of the leads 54*a* easy, and allowing the number of steps required for inspection of the lead to be reduced. However, even when the end is not made finely pointed, the dummy lead 52*a* can be used for the detection of finger bending.

It is preferable for the dummy leads (52*a* and so forth) to be formed at the same time as the conductor pattern is formed. However, without limitation to this, the dummy leads may equally be formed separately, using a different material, such as for example solder resist. It should be noted that in this case the dummy leads are formed using a well-known technology. It should be noted that the above-mentioned "dummy lead" is an example of a marking for lead bending detection, and other markings may also be used. For example, by forming slits by die-stamping out the insulating film at particular positions, these slits may be used as markings for bending detection.

Figure 21A:
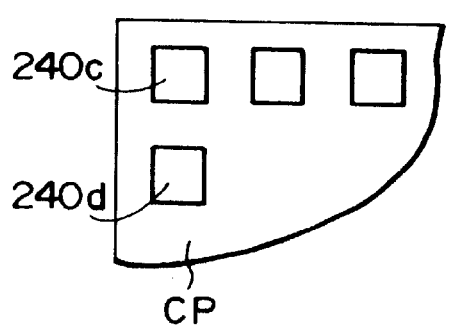
FIGS. 21A to 21D are explanatory diagrams showing yet further characteristics of the method of making a film carrier tape (method of making a semiconductor device) of the invention.
Figure 21B:
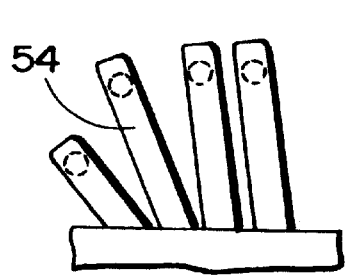
Figure 21C:
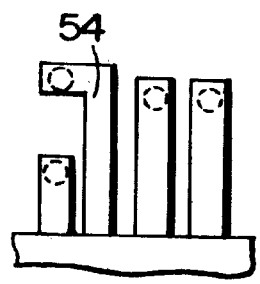

In the invention the extremities (fingers) of the leads are terminated and left as free ends. However, as shown in FIGS. 21A to 21D, in order for the free ends to correspond to the positions of the bonding pads of the IC chip, for example, it may be necessary for a plurality of the extremities (fingers) of the leads to be disposed on a single line. For example, as shown in FIG. 21A, bonding pads 240*c* and 240*d* of the IC chip (CP) are on the same line. In such a case, it is necessary for the leads 54 to be in a radiating pattern as shown in FIG. 21B, or to be bent as shown in FIG. 21C.

Figure 21D:
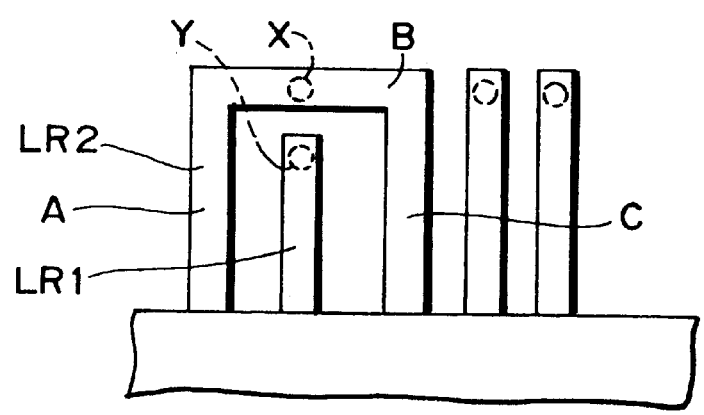

However, a radiating pattern of leads does not fit in an orthogonal coordinate system and causes problems in the fabrication of the film carrier tape. If the ends of the leads are bent, unnecessary movement due to gravity occurs, and twisting of the leads tends to occur. In such a case, the lead shape shown in FIG. 21D is adopted. That is to say, a lead LR2 is provided encircling another lead LR1. The LR2 lead comprises lead portions A, B and C extending in the direction which fits an orthogonal 20 coordinate system. In other words, the lead LR2 is not a free end, but is in a "U shape".

Figure 14:
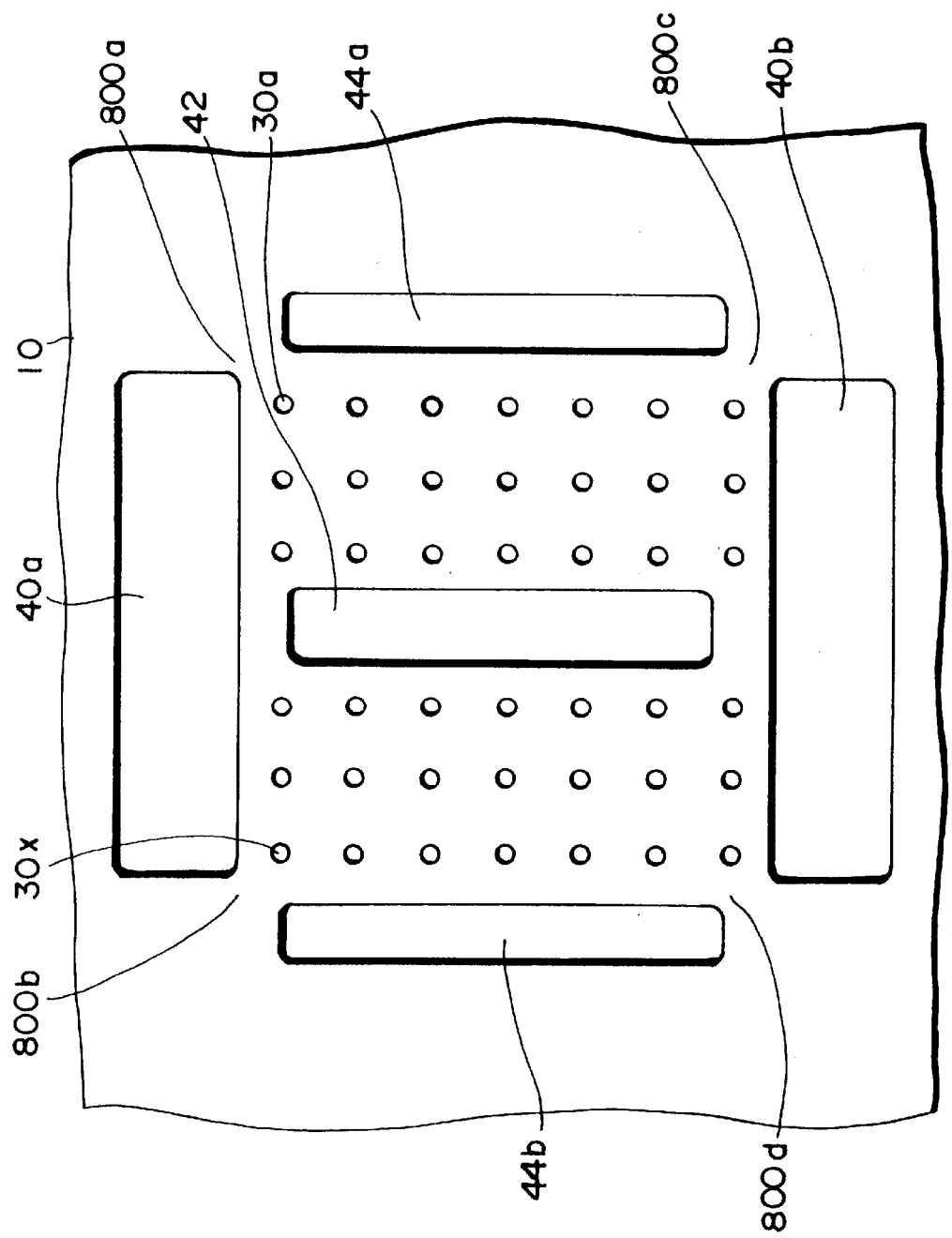
FIG. 14 is a plan view of the film carrier tape in the step of FIG. 2.

The Y portion of a lead LR1 is connected to bonding pad 240d of the IC chip (CP) in FIG. 21A, and the x portion of the lead LR2 is connected to bonding pad 240c. In other words, the point of contact (point x) with the IC chip is supported by two lead portions (A, C). By this means, no twisting movement occurs. The shape of the lead LR2 is preferably bilaterally symmetrical, in order to maintain the lateral balance. Next an example of the method of making a semiconductor device pertaining to the exemplary embodiment is described, with reference to FIGS. 1 to 12 (sectional views) and FIGS. 14 to 18 (plain views). FIG. 14 corresponds to FIG. 2, FIG. 15 corresponds to FIG. 5, FIG. 16 corresponds to FIG. 10, and FIG. 17 corresponds to FIG. 11. In particular, FIGS. 1 to 10 show steps of forming a flexible substrate, FIG. 11 shows a bonding step, and FIG. 12 shows a step of injecting resin.

Figure 1:
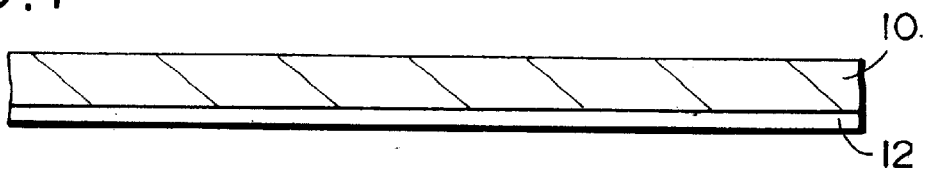
FIG. 1 is a cross-sectional view of a film carrier tape, showing the first step in the method of making a semiconductor device of the invention.

In step 1, as shown in FIG. 1, an insulating film (actually a polyimide film) 10 is provided, and on the reverse side of this insulating film 10 is applied an adhesive 12. It should be noted that as the insulating film, in place of the polyimide may be used, for example, a kind of polyester, or a BT resin, or a kind of glass epoxy or another kind of film material. In any case, the insulating film is a flexible material. It should be noted that in the following description, polyimide film is used as an example for the insulating film.

Figure 2:
FIG. 2 is a cross-sectional view of a film carrier tape, showing the second step in the method of making a semiconductor device of the invention.

In step 2, by using a desired means of making holes, for example, by stamping-out by a press, by laser process, or by a chemical etching process, as shown in FIGS. 2 and 14, openings are selectively formed in the polyimide film 10 to provide via holes 30 (30a 25 to 30x, and so forth), lead holes 40 (40a, 40b, and so forth), a resin injection hole 42, and resin stopping holes (44a and 44b). Here the lead holes 40a and 40b are formed of a size permitting insertion of a bonding tool 5000 as shown in FIG. 11.

It should be noted that the necessity of the via holes 30 is determined by the size of the polyimide film on which the wiring is formed. Also, the resin stopping holes (44a and 44b) are ancillary elements, and are not essential. The resin injection hole 42 may also be omitted by using for eusing for example the lead holes 40. However, when the speed of resin injection and the reliability of the injection are considered, the positive use of a resin injection hole 42 is preferable.

Figure 3:
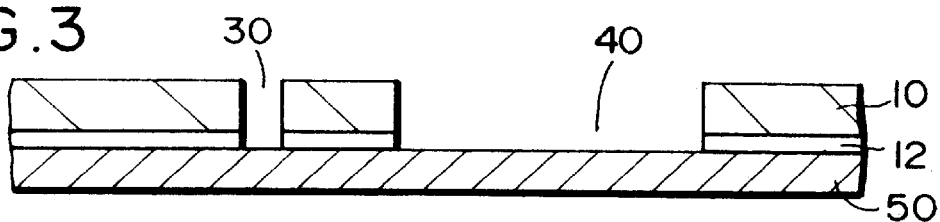
FIG. 3 is a cross-sectional view of a film carrier tape, showing the third step in the method of making a semiconductor device of the invention.

In step 3, as shown in FIG. 3, copper foil 50 is applied to the reverse side (the underside in this figure) of the polyimide film 10. If an adhesive is applied to the copper foil side, it is not necessary to apply an adhesive 12 to the polyimide film 10 in Step 1.

Figure 4:
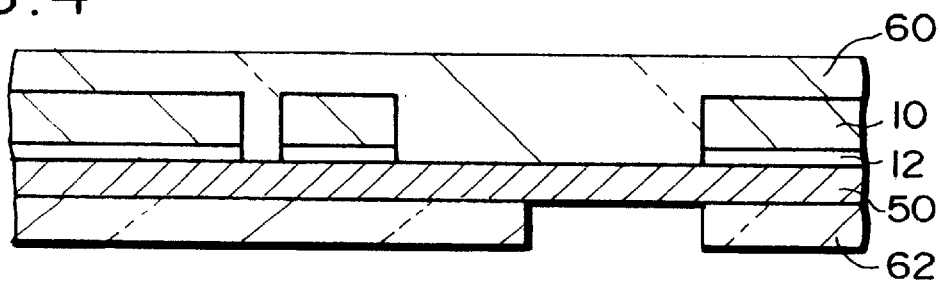
FIG. 4 is a cross-sectional view of a film carrier tape, showing the fourth step in the method of making a semiconductor device of the invention.

In step 4, as shown in FIG. 4, photoresist layers 60 and 62 are formed on both sides of the substrate including on the copper foil 50. In this figure, the front surface (the upper surface in the drawing) side is completely covered with photoresist, whereas on the reverse surface side, there are regions where the photoresist is not provided, in order to form a pattern.

Figure 5:
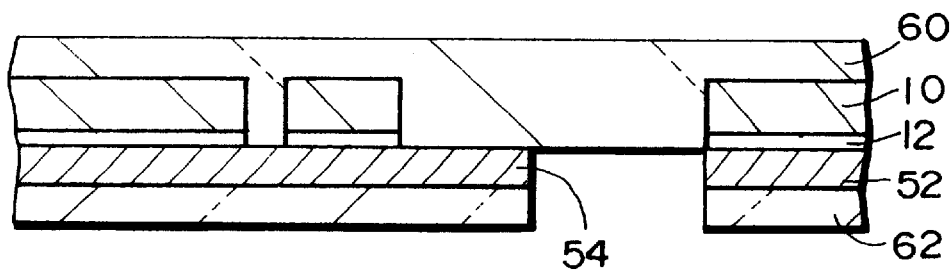
FIG. 5 is a cross-sectional view of a film carrier tape, showing the fifth step in the method of making a semiconductor device of the invention.

In step 5, as shown in FIG. 5, the copper foil 50 is etched to form a particular conductor pattern, and then the photoresist layer 62 is removed. The plain view of this state is in FIG. 15.

Figure 15:
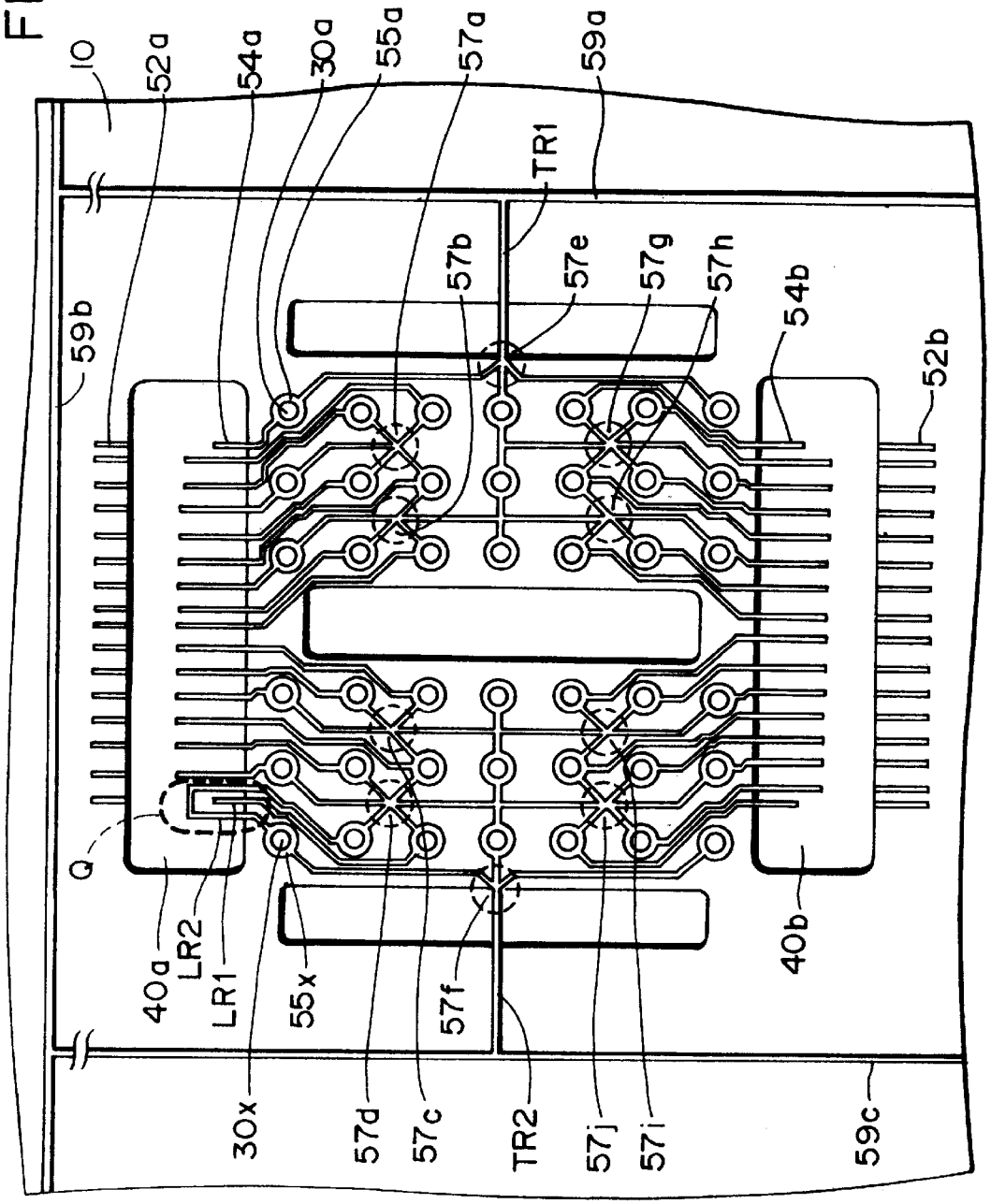
FIG. 15 is a plan view of the film carrier tape in the step of FIG. 6.

As shown in FIG. 15, the conductor pattern, of for example copper, comprises a frame 59a, 59b and 59c, leads (54a, 54b, LR1, LR2 and so forth), pad portions (55a to 55x and so forth) for forming electrically conducting projections, link portions (57a to 57i), and dummy leads (52a, 52b and so forth). In FIG, 15, portions corresponding to the same portions already described in FIGS. 19, 20, and 21D are given the same reference numerals. In FIG. 15, the portion Q surrounded by a dotted line corresponds to FIG. 21D.

In this state, the various elements excluding the dummy leads (52a, 52b and so on), that is to say, the frame 59a, 59b and 59c, leads (54a, 54b, LR1, LR2 and so forth), pad portions (55a to 55x and so forth) for forming electrically conducting projections, and link portions (57a to 57j) all have electrical continuity.

Figure 6:
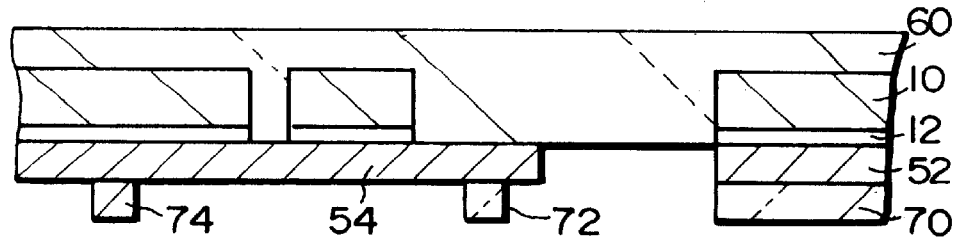
FIG. 6 is a cross-sectional view of a film carrier tape, showing the sixth step in the method of making a semiconductor device of the invention.

In step 6, in order to make the extremities (the portions connecting to the IC chip, the fingers) of the leads 54a and so forth project, and to form bumps for connection (FIG. 8), as shown in FIG. 6, photo resist layers 70, 72 and 74 are formed in particular positions on the conductor pattern on the reverse side. It should be noted that the lengths of the leads 54a, 54b, LR1 and LP2 are related to the positions of Al-electrodes 240a to 240d of an IC chip 200. Moreover, when as in this embodiment the leads 54a, 54b, LR1 and LR2 are formed on the side of the polyimide film 10 opposing the IC chip 200, they can be bonded to the Al-electrodes 240a to 240d without bending. As a result, since there is no need to consider a forming amount, the minimum length is sufficient. On the other hand, if the leads 54a, 54b, LR1 and LR2 are formed on the side of the polyimide film 10 opposite to the side facing the IC chip 200, it is necessary for them to be bent and bonded to the Al-electrodes 240a to 240d, and therefore it is preferable for a forming amount to be considered, and for the leads to be lengthened.

Figure 7:
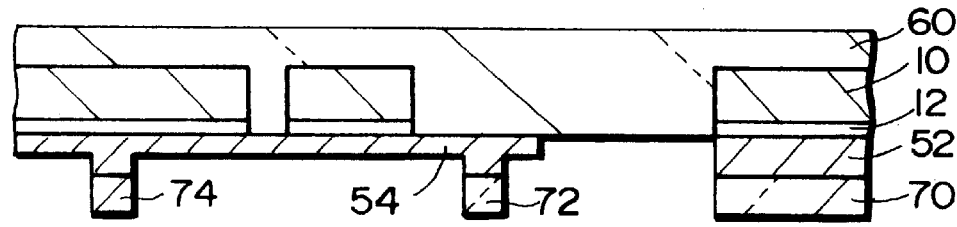
FIG. 7 is a cross-sectional view of a film carrier tape, showing the seventh step in the method of making a semiconductor device of the invention.

In step 7, as shown in FIG. 7, on the reverse side, the conductor pattern is half-etched in the thickness direction.

In step 8, as shown in rig. 8, the photoresist layers 60, 70, 72 and 74 are removed. As shown in the drawing, at the extremities (the portions connecting to the IC chip, the fingers) of the leads 54a and so forth are formed projections 56a. These projections 56a are connected to the Al-electrodes of the semiconductor chip in a subsequent bonding step.

It should be noted that at this time, portions other than the fingers may also have projections 56b formed appropriately. For example, the projections 56b may be used to form a gap between the conductor pattern and the IC chip for filling the resin.

Figure 8:
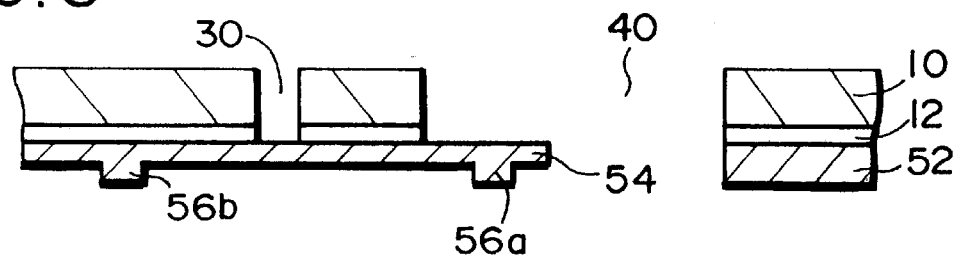
FIG. 8 is a cross-sectional view of a film carrier tape, showing the eighth step in the method of making a semiconductor device of the invention.

It should be noted that in the TAB step, in some cases for connection of the TAB leads and the semiconductor chip, metallic bumps (projections) may be formed on the semiconductor chip. In this case, the bumps are formed on the electrodes on the semiconductor chip. The material used is normally gold or solder or the like. In this case the projections 56a are not required on the lead 54a sides. Therefore, in this case, the steps in FIGS. 6 to 8 are not required.

On the other hand, this embodiment is described as an example in which, in place of forming bumps on the semiconductor chip, bumps (projections) are formed on the TAB lead sides. The technology for forming these lead extremities is an established technology already developed by the present applicant, and allows an existing TAB production line to be used. Besides, in this case, the aluminum pads on the semiconductor chip side may simply be exposed, and the process can be simplified since the metallic bumps are not required.

Figure 9:
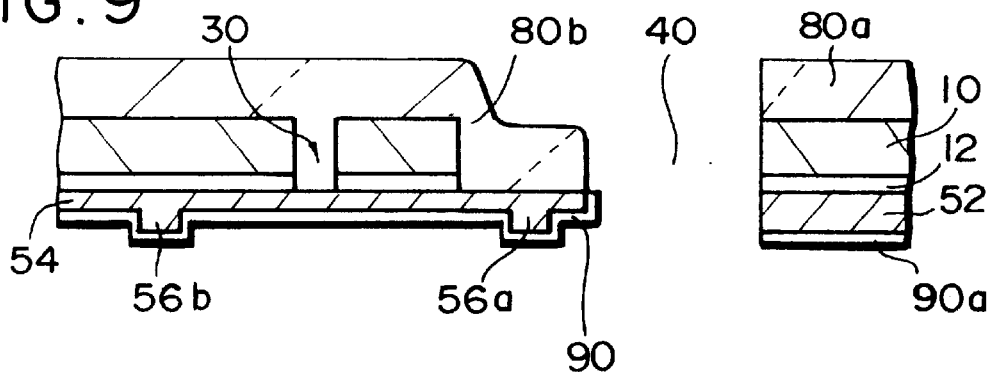
FIG. 9 is a cross-sectional view of a film carrier tape, showing the ninth step in the method of making a semiconductor device of the invention;.

In step 9, as shown in FIG. 9, after photoresist layers 80a and 80b are formed on the surface of the conductor pattern, electroplating is applied to the surface of the conductor pattern, and plating layers (90a to 90b) made of Ni/Au are formed. The nickel (Ni) functions as a barrier metal. This electroplating, as also described in FIG. 19, is carried out by applying a voltage to the frame 59a, 59b and 59c. For example, one electrode (generally the anode) is connected to the frame to allow a unified operation.

It should be noted that this invention is not restricted to electroplating. For example, electroless plating may be used carry out the plating of the pattern. After the plating process is completed, the photoresist layers 80a and 80b are removed.

Figure 16:
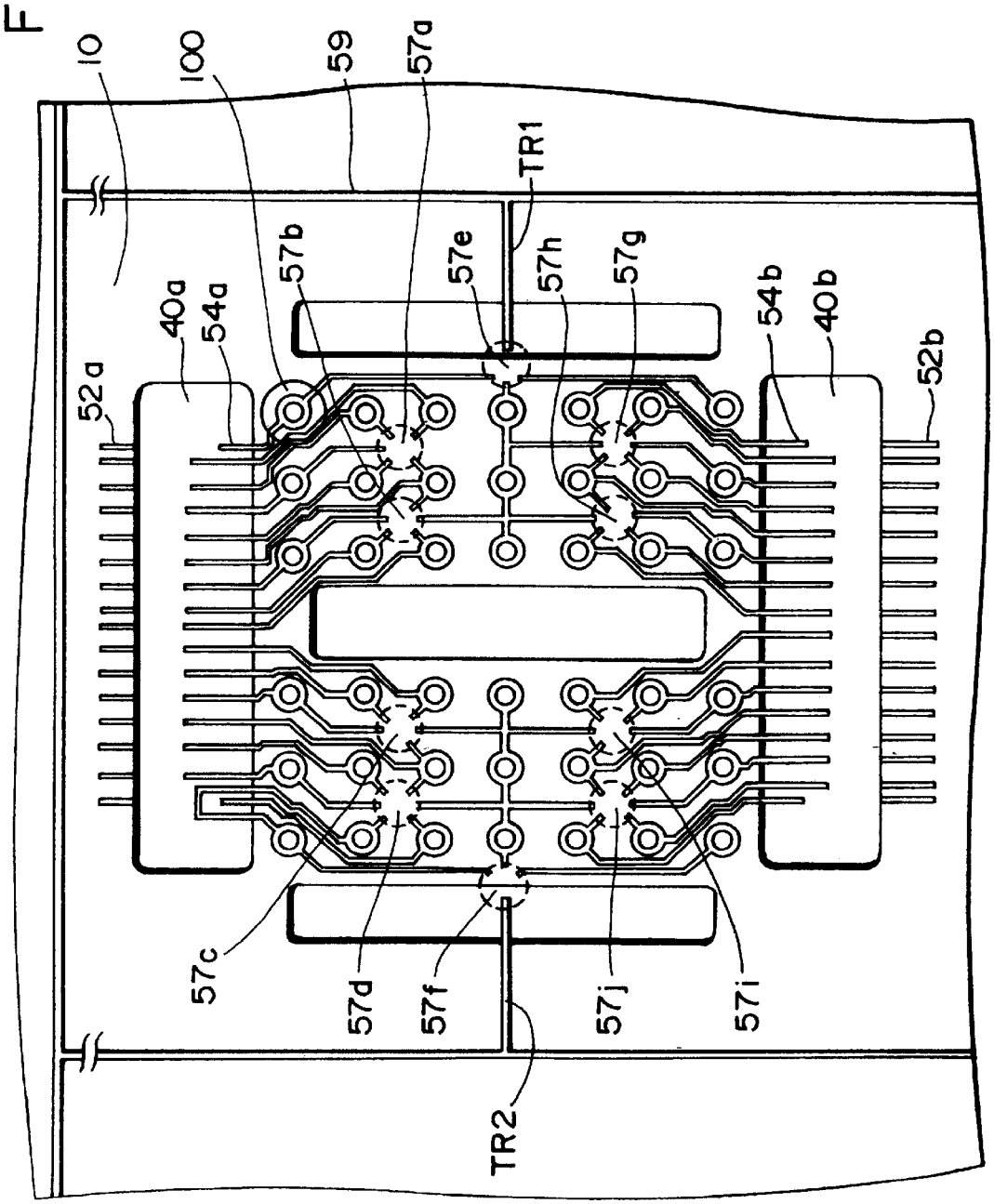
FIG. 16 is a plan view of the film carrier tape in the step of FIG. 10.

In step 10, first, as shown in FIG. 16, die-stamping of the link portions 57a to 57j is carried out. The die-stamping operation should preferably be carried out in a single operation when operating efficiency is considered, but may equally be split into a number of separate operations. By this means, the leads 54a are electrically isolated.

Next, as shown in FIG. 10, the via holes 30 are filled with a metal (nickel or the like) 98, and next external connection terminals (solder balls) 100 are formed.

It should be noted that to obtain height precision, a metal other than solder, such as aluminum, is inserted in the via holes. But to reduce the number of steps in the fabrication process, the via holes may be filled with solder and used in that state for forming the external connection terminals, thus allowing single-operation (integral) forming. By this, the film carrier tape for the CSP is completed (FIG. 16). It should be noted that if electroless plating is used, die-stamping need not be carried out.

At this stage, using the marking for lead bending detection, such as the dummy leads, as a reference, inspection for bent fingers is carried out to select bad and good items. In this embodiment, the step of forming the external connection terminals is carried out within the process of forming the flexible substrate, but this is not limiting. For example, there is a possibility of formation at any time after the bonding with the semiconductor chip. Portions inside the via holes may only be formed beforehand in the process of forming the flexible substrate, and in a separate later step the external connection terminals (solder balls) 100 may be formed. These selections may be made as a matter of convenience. In particular, in the case that solder is used for the external connection terminals, when the effect of heat from the tool during bonding is considered, it is preferable to form the external connection terminals after the bonding.

Figure 17:
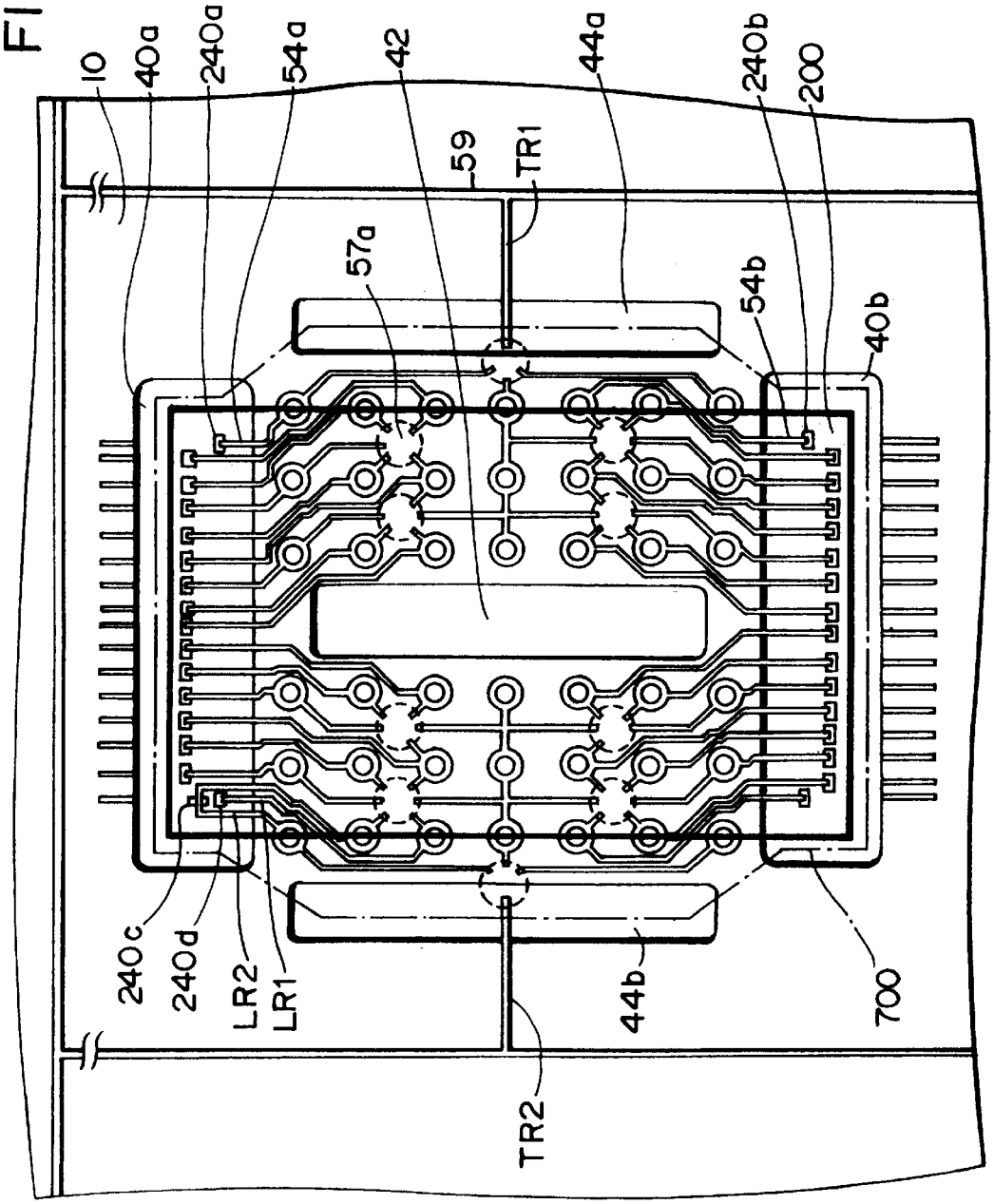
FIG. 17 is a plan view of the film carrier tape in the step of FIG. 11.

In step 11, as shown in FIGS. 11 and 17, the Al-electrodes (bonding pads) 204 (204a to 240d and so forth) of the IC Chip 200 are connected (bonded) to the extremity of each lead. This connection is carried out by applying heat and pressure from the bonding tool 5000 to the projections 56a, to create a Au/Al alloy. In FIG. 17, a heavy line indicates the IC chip 200. It should be noted that the free ends of the pattern are positioned within the area of the semiconductor chip.

In step 12, an epoxy resin is injected example, as shown in FIG. 12, the epoxy resin is injected through a resin injection hole(reference numeral 42 in FIG. 17). It should be noted that in place of the resin injection hole, for example, the lead holes 40 can be used for resin injection so that the provision of the resin injection hole is not necessarily essential. However, when the speed of resin injection and the reliability of the injection are considered, the result obtained is that the use thereof of the resin injection hole is preferable.

The resin covers the whole of the surface of the IC chip on which the Al-electrodes are formed (the active surface). In particular, the portion of connection of the IC chip 200 and the leads (54a and so forth) is completely covered. On the other hand, if the resin stopping holes 44a and 44b are provided, by their existence they restrict the lateral spread.

In FIG. 12, reference numerals 300a, 300b and 300c indicate a resin coating layer. As a result of positioning the finger extremities within the area of the semiconductor chip, the lateral surfaces of the extremities are also sealed by the resin 300a. The sides of the fingers on which the projections 56 are not provided are also filled with resin, and it is possible for the whole finger to be immersed in resin. However, in this case, it is necessary for the highest position of the resin to be set to be a position lower than the outer surface of the polyimide film 10. If this is not done, the connection of the external connection terminals 100 is impaired.

Next the injected resin is hardened by heat. At this time, the holes formed in the polyimide film 10 when the link portions (57a to 57j) were die-stamped out in Step 10, for example, act as gas escape holes for steam and the like generated by heating the package, and assist in improving the reliability of the package. Besides, it is also possible to use some of the holes formed when the link portions (57a to 57j) were die-stamped for resin injection. It is not, however, preferable that the holes are all used simultaneously as holes for resin injection. By means of the above steps, a tape carrier semiconductor device assembly is fabricated, having a plurality of IC chips connected.

It should be noted that in the example above, after the external connection terminals 100 are formed as shown in FIG. 10, by the steps in FIGS. 11 and 12, the tape carrier semiconductor device assembly is fabricated, but this is not limiting. As partially already noted above, for example, the external connection terminals 100 may be formed after the resin sealing step of FIG. 12. In this case, if the external connection terminals are formed after the IC chip 200 and the connection portions between the leads 54a and the IC chip 200 are covered by resin, there is no danger of contaminating the chip area when the external connection terminals are formed, and therefore there is the advantage that the reliability can be improved.

Figure 18:
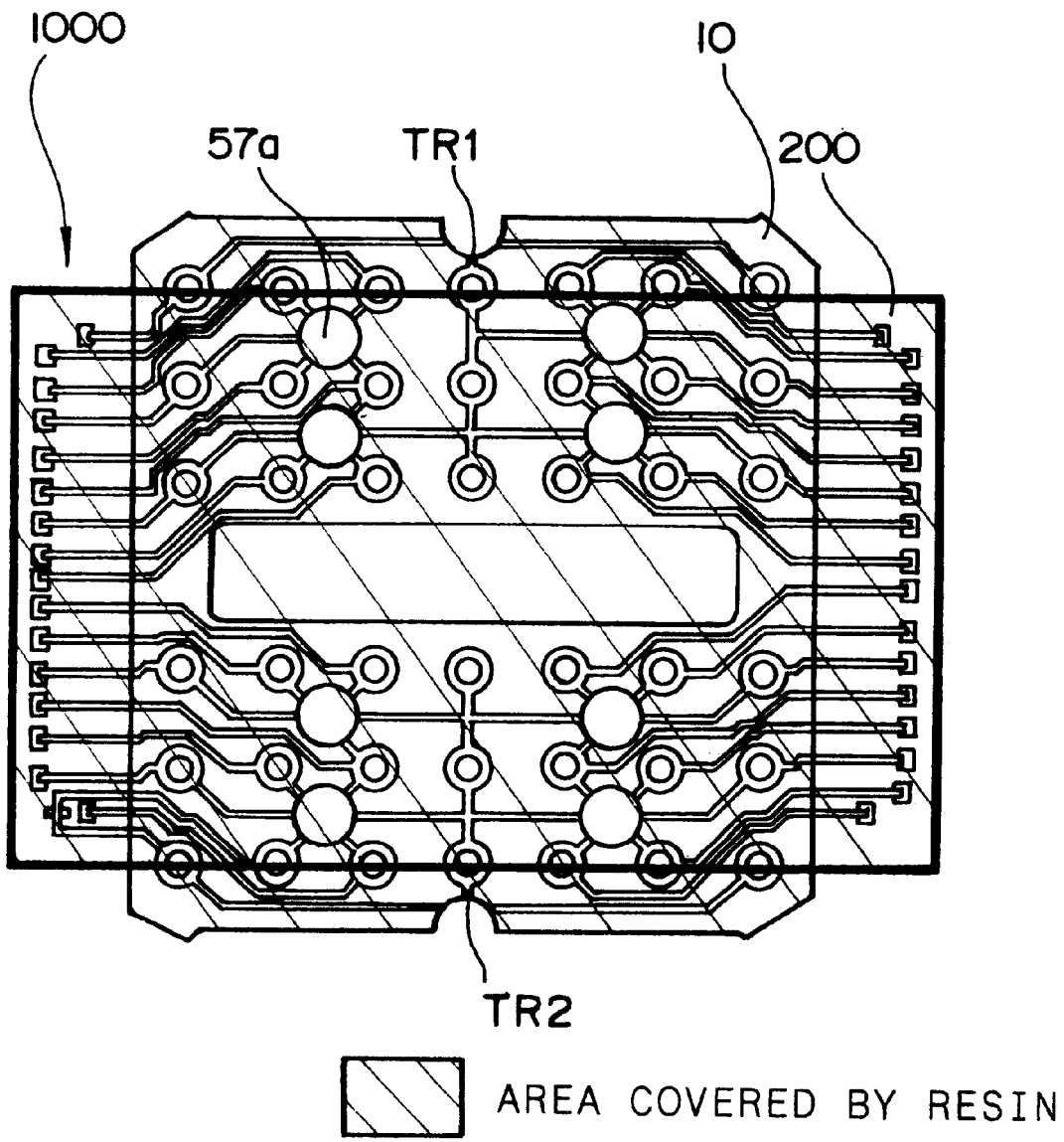
FIG. 18 is a plan view of an individual sized semiconductor device of the invention.

In step 13, the polyimide film 10 is die-stamped out along the CSP end 700 shown surrounded by a dot-dash line in FIG. 17. By this means a chip-size semiconductor device (CSP) 1000 as shown in FIG. 18 is completed. In FIG. 18, the hatched area is the area covered by resin. As shown in the drawings, only the cut surfaces of the suspension leads TR1 and TR2 are exposed, and the damp resistance is excellent. Also because it takes the form of a package, burn-in and other testing is possible.

It should be noted that in the above example the conductor pattern is formed on the reverse side of the insulating film 10, but this is not limiting, and application is also possible when formed on the front side of the insulating film 10, and moreover a similar benefit is obtained.

Figure 13:
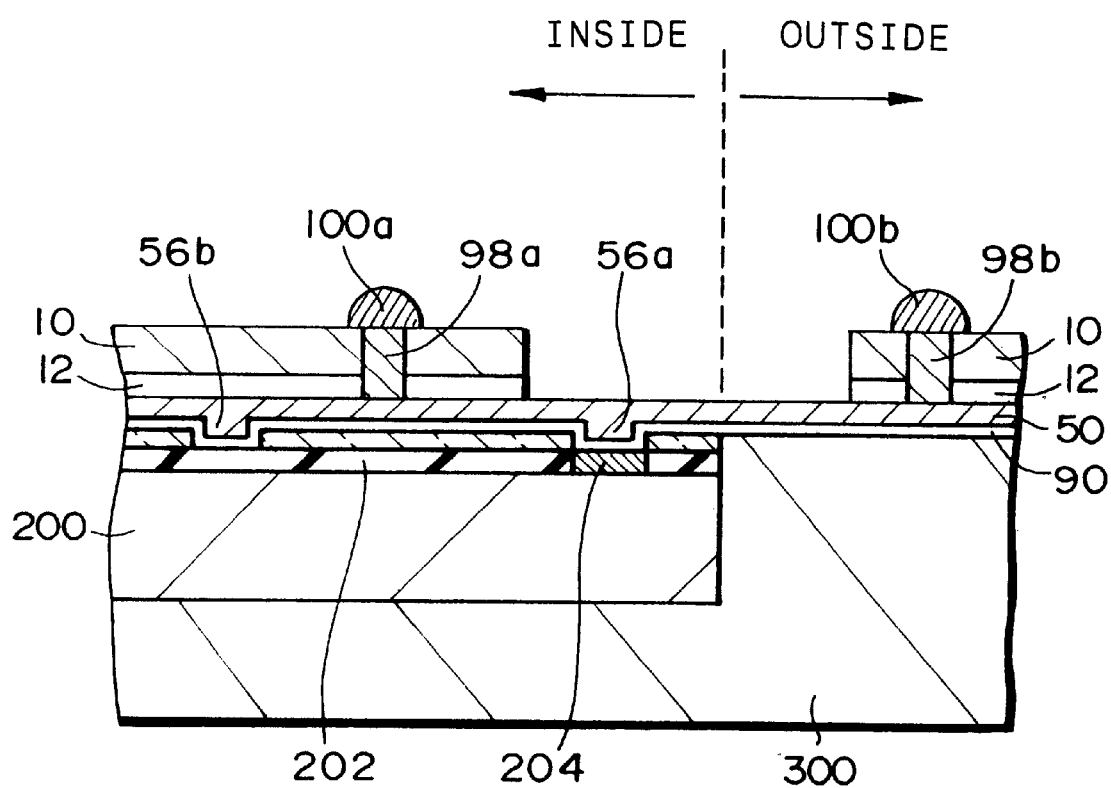
FIG. 13 is a cross-sectional view of a device showing a variant example of the semiconductor device of the invention.
Figure 22:
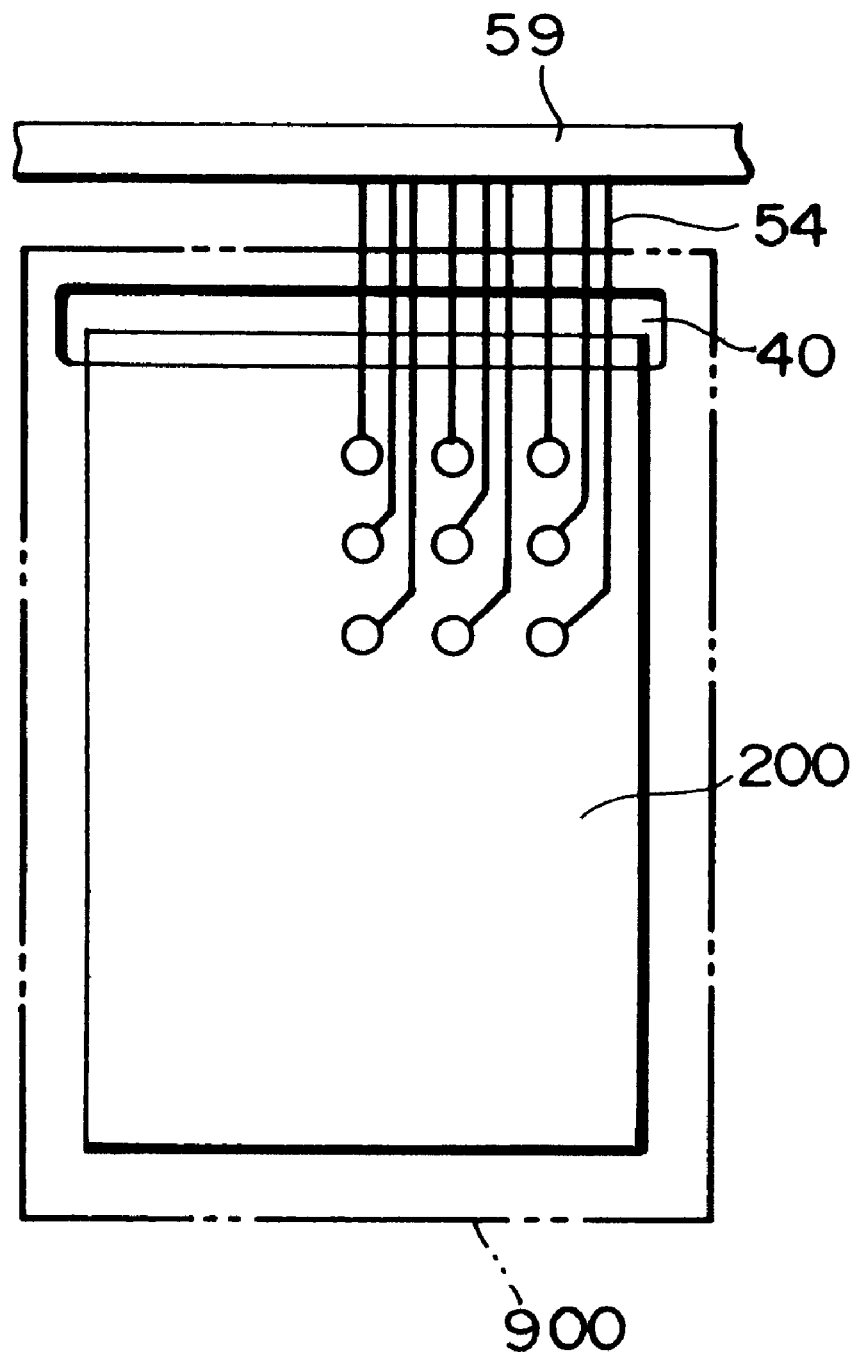
FIG. 22 is a diagram showing a variant example of the method of making a film carrier tape (method of making a semiconductor device) of the invention.

A second exemplary embodiment, as shown in FIG. 13, not only in the interior of the IC chip 200, but external connection terminals (solder balls) 100b may also be formed on the exterior. In this embodiment, the IC chip 200 is disposed within a concavity of a can container 300, and leads 50 extend over the can container 300. Then metal-electrodes 98b are formed within the via holes, and solder balls 100b are connected to these metal-electrodes 98b. According to this embodiment, with no restrictions from the size of the IC chip 200, the number of external connection terminals (solder balls) can be freely increased. In another embodiment, when the demands of package size are relatively soft, as shown in FIG. 22, the method of fabrication can be adopted in which after the connection (bonding) of the IC chip 200 and the leads 54 is completed, die-stamping is carried out on the outside of the connection points with the chip (in FIG. 22, die-stamping at the CSP end 900 shown by 4 double-dot-dash line), and the leads 54 are cut away from the frame 59. By means of this method of manufacture, since the leads are cut away from the frame in the last step of the process, there is no danger of bonding defects due to lead bend.

Figure 23:
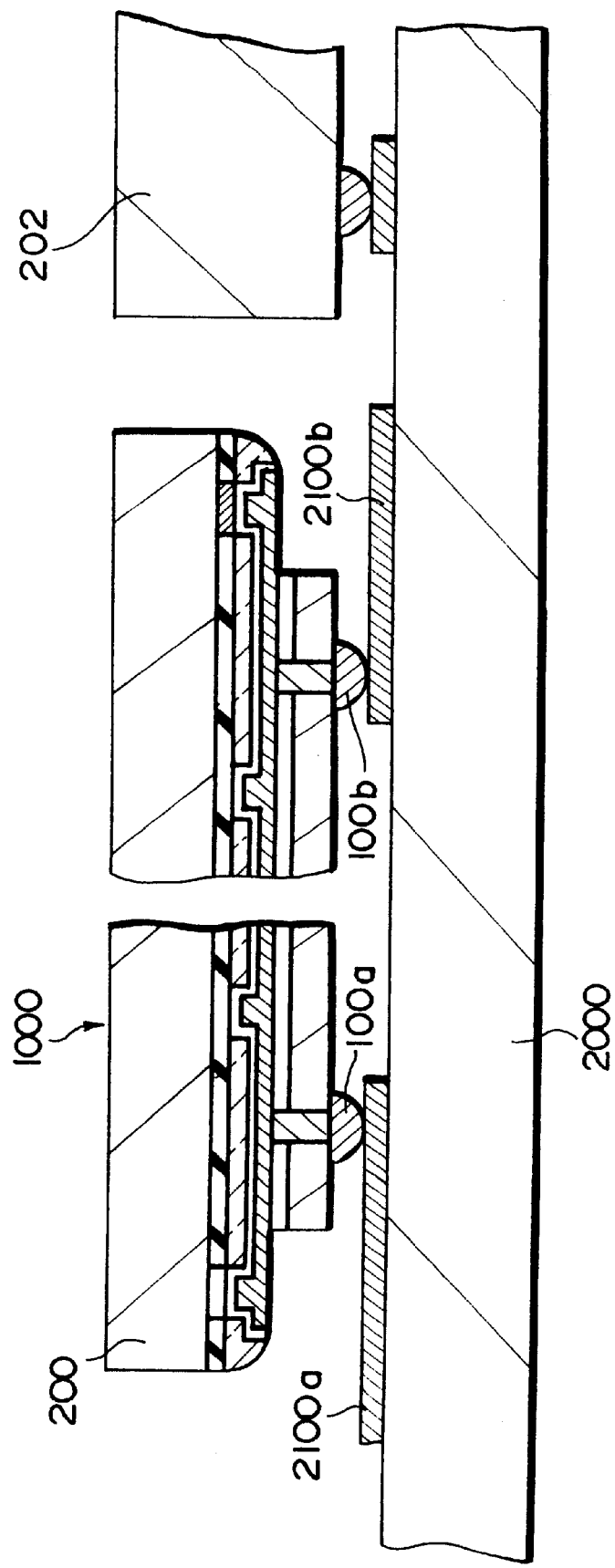
FIG. 23 is a cross-sectional view of the mounted board of the invention.

In another embodiment, FIG. 23 shows a state in which a chip-size semiconductor device (CSP) 1000 is mounted on a printed wiring board 2000. The external connection terminals (solder balls) 100a and 100b of the chip-size semiconductor device (CSP) 1000 are connected to a conductor pattern 2100a and 2100b on the printed wiring board 2000 (mounting substrate). Since the package size is chip size, an extremely high mounting density is possible. It should be noted that in FIG. 23, reference numeral 202 indicates another IC mounted on the printed wiring board 2000.

Figure 24:
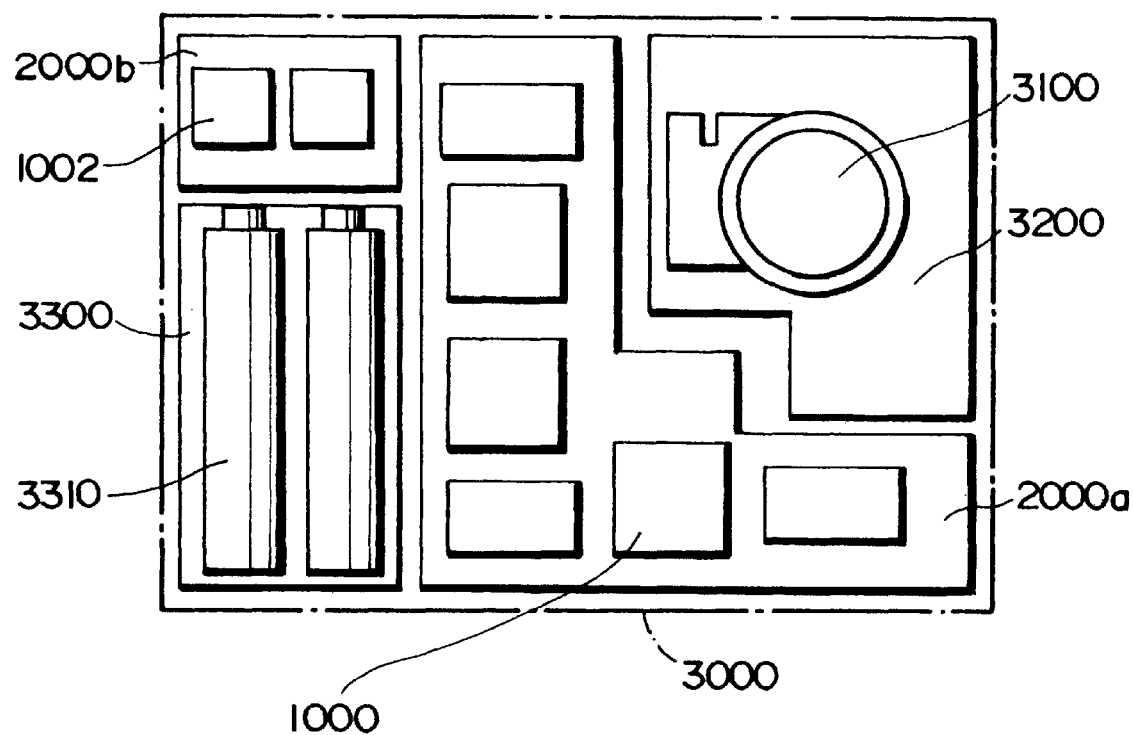
FIG. 24 is a diagram showing the interior of the electronic device of the invention.

In another embodiment, FIG. 24 is a view showing the interior of a camera integrated VTR incorporating mounting substrates with chip-size semiconductor devices (CSP) mounted thereon of the invention. The camera integrated VTR 3000 incorporates two mounting substrates 2000a and 2000b, and on each of the mounting substrates are mounted CSPs 1000 and 1002 of the invention. In FIG. 24, reference numeral 3100 indicates a lens, reference numeral 3200 indicates a lens unit, reference numeral 3300 indicates a battery box, and reference numeral 3310 indicates a battery. In this way, since the semiconductor device (CSP) of the invention is chip size, it can be applied to a camera integrated VTR and other portable instruments in which compact and lightweight design is of the essence. Furthermore, the semiconductor device (CSP) of the invention has high reliability in respect of its resistance to moisture and resistance to heat, and this leads to the improvement of the reliability of an electronic instrument.

What is claimed is:

1. A method of making a film carrier tape comprising:
 a step of forming conducting foil on an insulating film;
 a step of forming from the conducting foil a conductor pattern having a plurality of leads each with one end formed as a free end and with an electrical connection portion on the free end for connection to at least one semiconductor chip, link portions linking together the plurality of leads and provided within a mounting area of the semiconductor chip, and a frame electrically connected to all of the leads through the link portions;
 a step of plating conductor pattern; and
 a step of stamping out the link portions, electrically isolating each of the plurality of leads.

2. The method of making a film carrier tape of claim 1, wherein, in the step of forming the conductor pattern, pad portions for forming external connection terminals are further formed between the leads and the link portions.

3. The method of making a film carrier tape of claim 1, further comprising, before the step of forming the conducting foil, a stamping out step of forming a hole at a predetermined position in the insulating film.

4. The method of making a film carrier tape of claim 1, wherein the semiconductor chip has electrodes positioned away from the electrical connection portion on the free end of the plurality of leads, further comprising a step of forming a electrically conducting projection on each of the leads at a position differing from the free end where one of the electrodes is to be positioned.

5. The method of making a film carrier tape of claim 1, further comprising a step of forming a projection in an area excluding the electrical connection portion of the conductor pattern where the semiconductor chip is mounted.

6. The method of making a film carrier tape of claim 1, wherein, before the step of forming the conductor pattern, an opening is formed in the insulating film, and an edge of the free end is positioned within an area of the opening.

7. The method of making a film carrier tape of claim 6, wherein, at a position adjacent to the opening in the insulating film and on an extended line from the free end of each of the leads, a marking for bending detection of each of the leads is formed.

8. The method of making a film carrier tape of claim 7, wherein the marking for bending detection is formed in the step of forming the conductor pattern in a same process as the conductor pattern.

9. The method of making a film carrier tape of claim 7, further comprising a step of detecting a bend in each of the leads by comparing between a position of the marking for bending detection and a position of the marking for bending detection and a position of the free end terminating each of the leads.

10. The method of making a film carrier tape of claim 6, wherein, in the step of forming the conductor pattern, the plurality of leads is formed to have a pair of projections projecting from the insulating film over the opening and a connection portion connecting the pair or projections.

11. The method of making a film carrier tape of claim 10, wherein the projections and the connection portion form a right angle.

12. The method of making a film carrier tape of claim 11, wherein one of the pair of projections is separated, and one of the plurality of leads is provided therebetween.

13. The method of making a film carrier tape of claim 1, wherein, in the step of forming the conductor pattern, a process is carried out in a thickness direction of each of the plurality of leads so that the electrical connection portion to the semiconductor chip on each of the leads is to have a projecting shape.

14. A film carrier tape made by the method of making a film carrier tape claim 1.

15. A film carrier tape comprising:
 an insulating film having a lead hole formed therein;
 a lead on the insulating film, the lead having one end which extends into an area of the lead hole to be a free end; and
 a marking for bending detection of the lead formed on the insulating film and positioned on an extended line from the free end.

16. The film carrier tape of claim 15, wherein a pad portion for forming an external connection terminal is formed a different end of the lead.

17. A film carrier tape obtained by:
 making an insulating film having a lead hole formed therein;
 forming a conductor pattern on the insulating film having a plurality of leads for connection to a semiconductor chip, a link portion linking together the plurality of leads and provided within a mounting area of the semiconductor chip, and a frame electrically connected to all of the leads through the link portion; and forming a hole in the link portion of the conductor pattern.

18. A film carrier tape comprising:

an insulating film;

a plurality of leads formed in parallel on the insulating film;

a pair of leads positioned on the insulating film adjacent to the plurality of leads, the pair of leads separated by a predetermined distance and mutually connected together; and another lead formed between the pair of leads.

19. A method of making a tape carrier semiconductor device assembly wherein, on the insulating film of the film carrier tape of claim 14 are mounted a plurality of the semiconductor chips, and electrodes of each of the semiconductor chips are connected to the free end of each of the plurality of leads which is terminated.

20. The method of making a tape carrier semiconductor device assembly of claim 19, further comprising a step of filling a sealing material between the semiconductor chips and the insulating film.

21. A method of making a semiconductor device by finally die-stamping out the tape carrier semiconductor device assembly made by the method of making a tape carrier semiconductor device assembly of claim 19.

22. A semiconductor device made by the method of making a semiconductor device of claim 21.

23. A mounted board having a conductive layer formed thereon, wherein an external connection terminal of the semiconductor device of claim 22 is connected to the conductive layer.

24. An electronic device incorporating the mounted board of claim 23.

25. A method of making a semiconductor device comprising:

a step of forming conducting foil on an insulating film;

a step of forming from the conducting foil a conductor pattern having a plurality of leads each with one end formed as a free end for connection to a semiconductor chip, a link portion linking together the plurality of leads and provided within a mounting area of the semiconductor chip, and a frame electrically connected to all of the leads through the link portion;

a step of plating the conductor pattern;

a step of stamping out the link portion, thereby electrically isolating each of the plurality of leads;

a step of connecting a part of the leads to electrodes of the semiconductor chip; and a step of finally separating the frame and the plurality of leads, forming the semiconductor device.

26. The method of making a semiconductor device of claim 25, further comprising a step of filling a resin between the semiconductor chip and the insulating film, between the step of connecting to electrodes and the step of separation to form the semiconductor device.

* * * * *